(12) United States Patent
Scanzillo et al.

(10) Patent No.: US 10,840,721 B2
(45) Date of Patent: Nov. 17, 2020

(54) SYSTEM AND METHOD FOR CONTROLLING AN ELECTRICAL RECEPTACLE

(71) Applicant: Hubbell Incorporated, Shelton, CT (US)

(72) Inventors: Thomas Scanzillo, Monroe, CT (US); Matthew Samojeden, Rye, NY (US); Steve Liscinsky, Stratford, CT (US); Shadi AbuGhazaleh, Guilford, CT (US); Blake Nickles, Greenville, SC (US); Robert Cordery, Monroe, CT (US)

(73) Assignee: Hubbell Incorporated, Shelton, CT (US)

(*) Notice: Subject to any disclaimer, the term of this patent is extended or adjusted under 35 U.S.C. 154(b) by 0 days.

(21) Appl. No.: 16/013,386

(22) Filed: Jun. 20, 2018

(65) Prior Publication Data

US 2018/0366954 A1 Dec. 20, 2018

Related U.S. Application Data

(60) Provisional application No. 62/522,551, filed on Jun. 20, 2017.

(51) Int. Cl.
| | | |
|---|---|---|
| H02J 7/00 | (2006.01) | |
| H02J 7/02 | (2016.01) | |
| G05B 19/042 | (2006.01) | |
| G01R 31/36 | (2020.01) | |
| H01R 13/66 | (2006.01) | |

(Continued)

(52) U.S. Cl.
CPC .......... *H02J 7/007* (2013.01); *G01R 31/3648* (2013.01); *G05B 19/042* (2013.01); *H01R 13/6691* (2013.01); *H02J 7/02* (2013.01); *H02J 7/345* (2013.01); *G05B 2219/23352* (2013.01); *H01R 13/6675* (2013.01); *H01R 13/6683* (2013.01); *H01R 24/62* (2013.01); *H01R 25/006* (2013.01); *H01R 27/02* (2013.01); *H02J 7/00* (2013.01); *H02J 7/0029* (2013.01); *H02J 7/0049* (2020.01)

(58) Field of Classification Search
CPC ........................................................ H02J 7/00
USPC ................................................. 320/111, 112
See application file for complete search history.

(56) References Cited

U.S. PATENT DOCUMENTS

| | | | |
|---|---|---|---|
| 2014/0354065 A1 | 12/2014 | Pomp-Melchers | |
| 2016/0036259 A1* | 2/2016 | Cheatham, III | ...... H02J 7/0042 320/103 |

(Continued)

OTHER PUBLICATIONS

PCT/US2018/038519 International Search Report and Written Opinion dated Sep. 12, 2018 (15 pages).

*Primary Examiner* — Edward Tso
*Assistant Examiner* — Ahmed H Omar
(74) *Attorney, Agent, or Firm* — Michael Best & Friedrich, LLP

(57) ABSTRACT

A power receptacle including an outlet configured to electrically connect to a load device and an electronic processor. The electronic processor is configured to determine a state of charge of a battery of the load device. The electronic processor is further configured to supply power to the load device when the state of charge of the battery is below a predetermined threshold and to discontinue supply of power to the load device when the state of charge of the battery is at or above the predetermined threshold.

15 Claims, 6 Drawing Sheets

(51) Int. Cl.
    *H02J 7/34*     (2006.01)
    *H01R 27/02*     (2006.01)
    *H01R 24/62*     (2011.01)
    *H01R 25/00*     (2006.01)

(56) References Cited

U.S. PATENT DOCUMENTS

2016/0046199 A1*   2/2016   Butler .................. H02J 7/0004
                                                                  320/106
2017/0155526 A1*   6/2017   Li ...................... H01R 13/6675

\* cited by examiner

SYSTEM AND METHOD FOR CONTROLLING AN ELECTRICAL RECEPTACLE

RELATED APPLICATIONS

This application claims the benefit to U.S. Provisional Patent Application No. 62/522,551, filed on Jun. 20, 2017, the entire contents of which are incorporated herein by reference.

FIELD

Embodiments relate to electrical receptacles.

SUMMARY

Electrical receptacles, such as arc fault circuit interrupters (AFCI) receptacles or ground fault circuit interrupters (GFCI) receptacles, are configured to provide power to a load device electrically connected to the electrical receptacle. The load device may include a battery, which is charged using power received from the electrical receptacle. Typically, when electrically connected to the power supply, power is constantly supplied from the receptacle to the load device, even when the battery of the load device is at a fully charged state. Constantly supplying power, when the battery is at a fully charged state, is not only inefficient, may also damage the battery and/or decrease battery life.

Thus, one embodiment provides a power receptacle including an outlet configured to electrically connect to a load device and an electronic processor. The electronic processor is configured to determine a state of charge of a battery of the load device. The electronic processor is further configured to supply power to the load device when the state of charge of the battery is below a predetermined threshold and to discontinue supply of power to the load device when the state of charge of the battery is at or above the predetermined threshold.

Another embodiment provides a method of operating a power receptacle electrically connected to a load device. The method includes determining a state of charge of a battery of the load device. The method further includes supplying power to the load device when the state of charge of the battery is below a predetermined threshold and discontinuing supply of power to the load device when the state of charge of the battery is at or above the predetermined threshold.

Other aspects of the application will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

Figure 1:
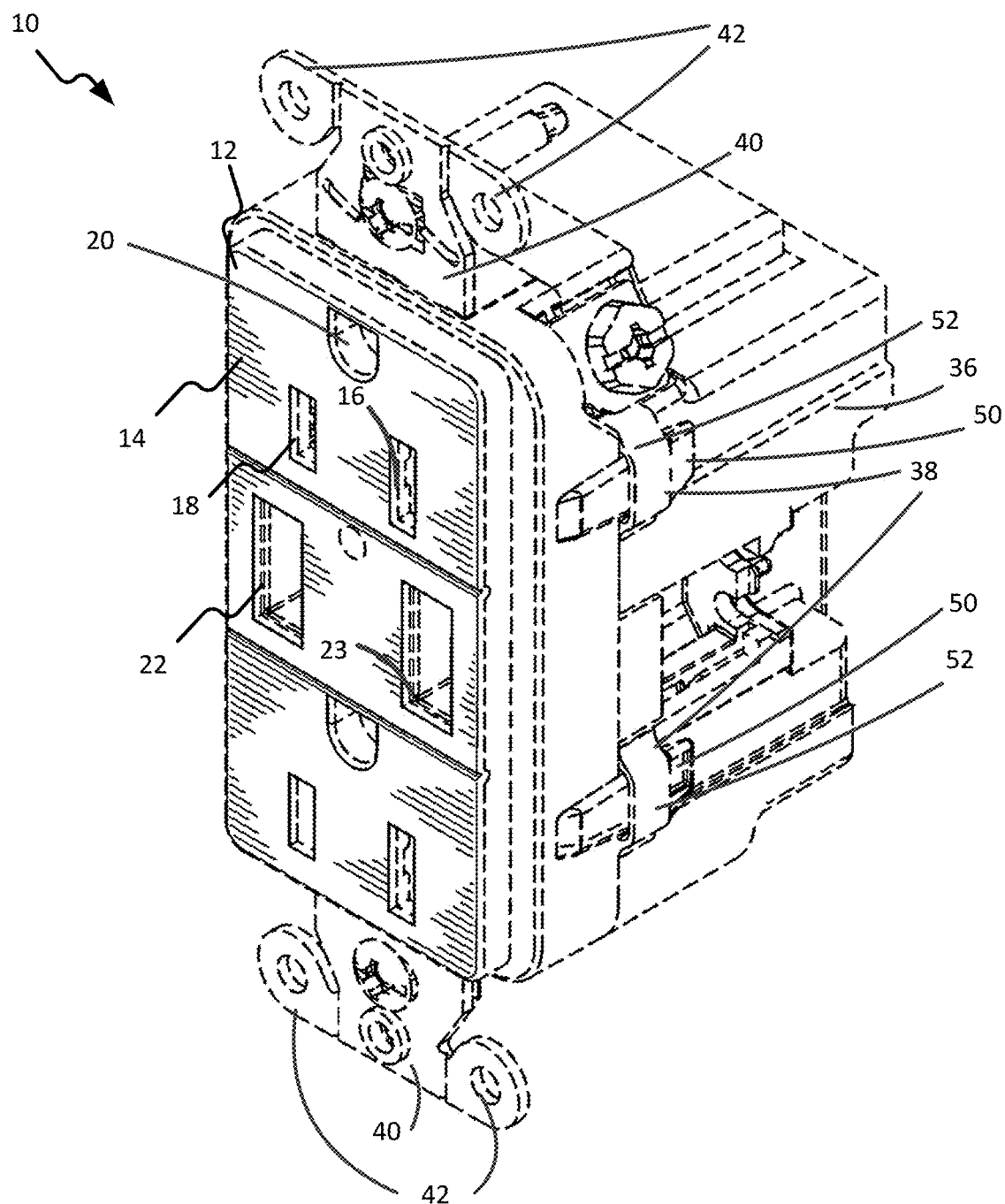
FIG. 1 is a perspective view of an electrical receptacle according to some embodiments.

FIG. 1 illustrates a perspective view of a receptacle 10 according to one embodiment of the application. In some embodiments, the receptacle 10 is an arc fault circuit interrupter (AFCI) device or a ground circuit interrupter (GFCI) device. In some embodiments, the receptacle 10 is a receptacle configured to provide 120 VAC and/or 220 VAC from the mains to a device electrically coupled to the receptacle. In some embodiments, the receptacle 10 may include a Universal Serial Bus (USB) outlet or other direct current (DC) outlet configured to provide a DC voltage.

Figure 2A:
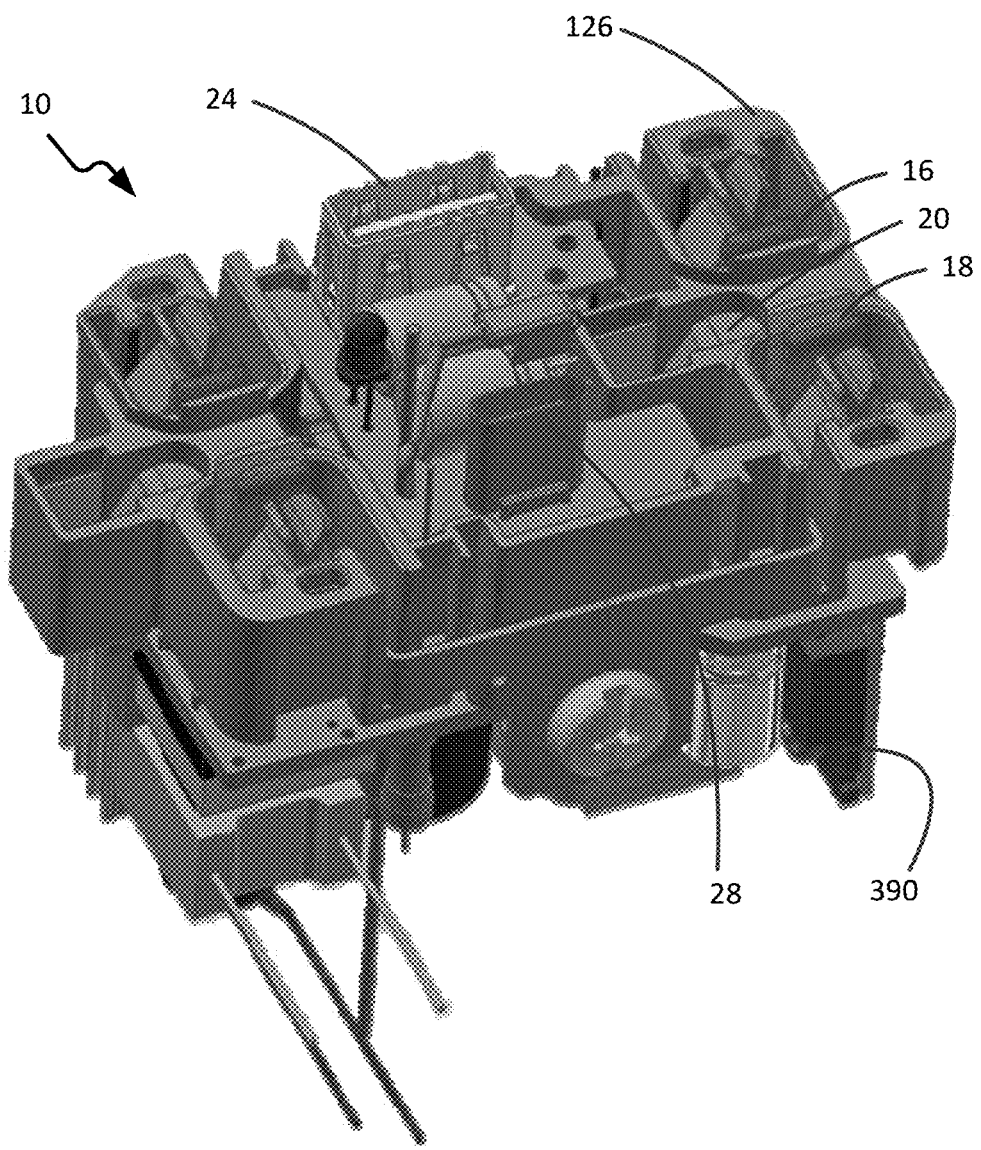
FIG. 2A is a partially exposed front perspective view of the electrical receptacle of FIG. 1 according to some embodiments.
Figure 2B:
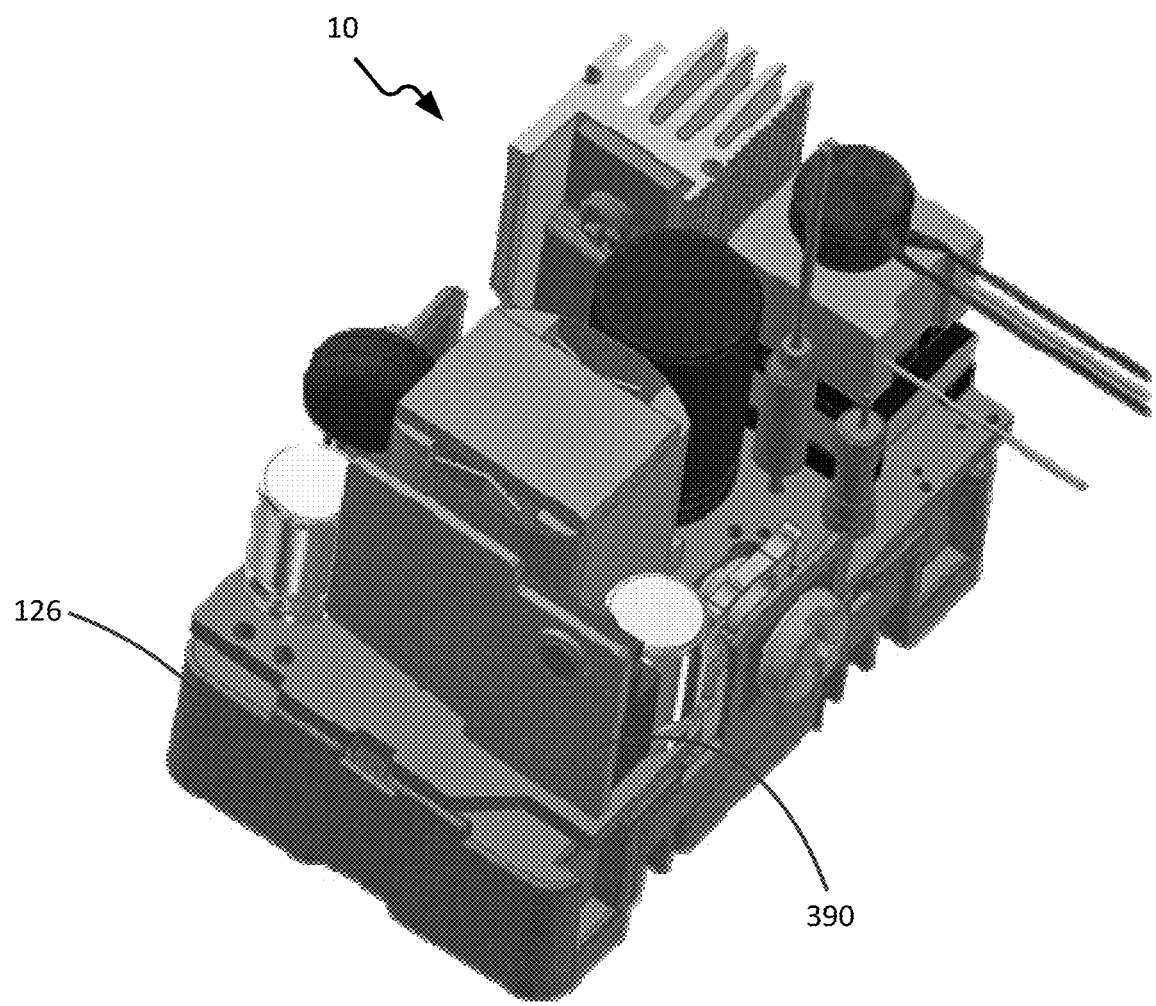
FIG. 2B is a partially exposed back perspective view of the electrical receptacle of FIG. 1 according to some embodiments.

In the illustrated embodiment, the receptacle 10 includes a cover 12 having a duplex outlet face 14 with a phase opening 16, a neutral opening 18, and a ground opening 20. Additionally, in the illustrated embodiment, the face 14 further has an opening 22 and an adjacent opening 23. The openings 22 and 23 are configured to accommodate outlets in addition to the duplex outlet face 14. For example, as illustrated in FIGS. 2A and 2B, the opening 23 accommodates a first outlet 24 and the opening 22 accommodates a second outlet 28. The outlets 24 and 28 may be the same type of power outlet or each be a different type. For example, in the illustrated embodiment, the first outlet 24 is a universal serial bus (USB) outlet and the second outlet 28 is a Lightning Port™ by Apple Inc. In other embodiments, the receptacle 10 includes a single USB (or other type of) outlet and/or a single outlet face.

In the illustrated embodiment, the outlet 24 facilitates connections between a USB charging assembly within the receptacle 10 and to an external device including a USB port. However, as stated above, it should be appreciated that any electrical power/communication connector may be configured with the disclosed openings 22 and 23 for supplying power to an external device.

Returning to FIG. 1, the receptacle 10 further includes a rear cover 36 secured to the front cover 12 by four fasteners 38 (two fasteners 38 are shown in FIG. 1, while the other two fasteners 38 are obstructed from view). In some embodiments, the fasteners 38 include a barbed post 50 on the front cover 12 and a corresponding resilient hoop 52 on the rear cover 36, similar to that which is described in detail in U.S. Pat. No. 6,398,594, the entire contents of which are incorporated herein by reference for all that is taught. A ground yoke/bridge assembly 40 includes standard mounting ears 42 protruding from the ends of the receptacle 10.

FIGS. 2A and 2B each illustrate a perspective view of the front and back (respectively) of the receptacle 10 with the front cover 12 removed to expose manifold 126. Manifold 126 provides support for a printed circuit board (PCB) 390 and the yoke/bridge assembly 40 (FIG. 1). The PCB 390 includes some or all of the control system 200 (FIG. 4).

Figure 3:
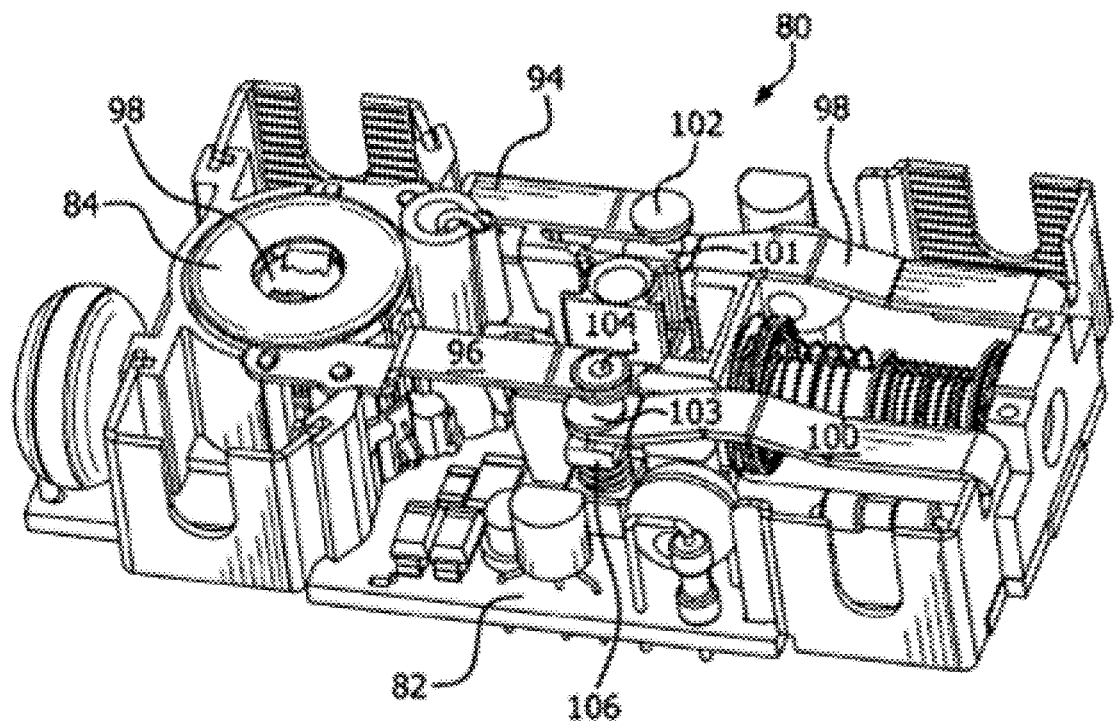
FIG. 3 is a partially exposed view of the electrical receptacle of FIG. 1 according to some embodiments.

FIG. 3 is a side elevation view of a core assembly 80 according to some embodiments. Core assembly 80 may include a circuit board PCB 82 that supports some of the working components of the receptacle 10. In some embodiments, the PCB 82 may be part of the PCB 390 and includes some or all of the control system 200 (FIG. 4). Line contact arms 94, 96 are cantilevered, their respective distal ends carrying phase and neutral line contacts 102, 104. Load contact arms 98, 100 are also cantilevered with their respective distal ends carrying phase and neutral load contacts 101, 103. The resiliency of the cantilevered contact arms biases the line contacts 102, 104 and load contacts 101, 103 away from each other. Load contact arms 98, 100 rest on a movable contact carriage 106, made of insulating (preferably thermoplastic) material.

Figure 4:
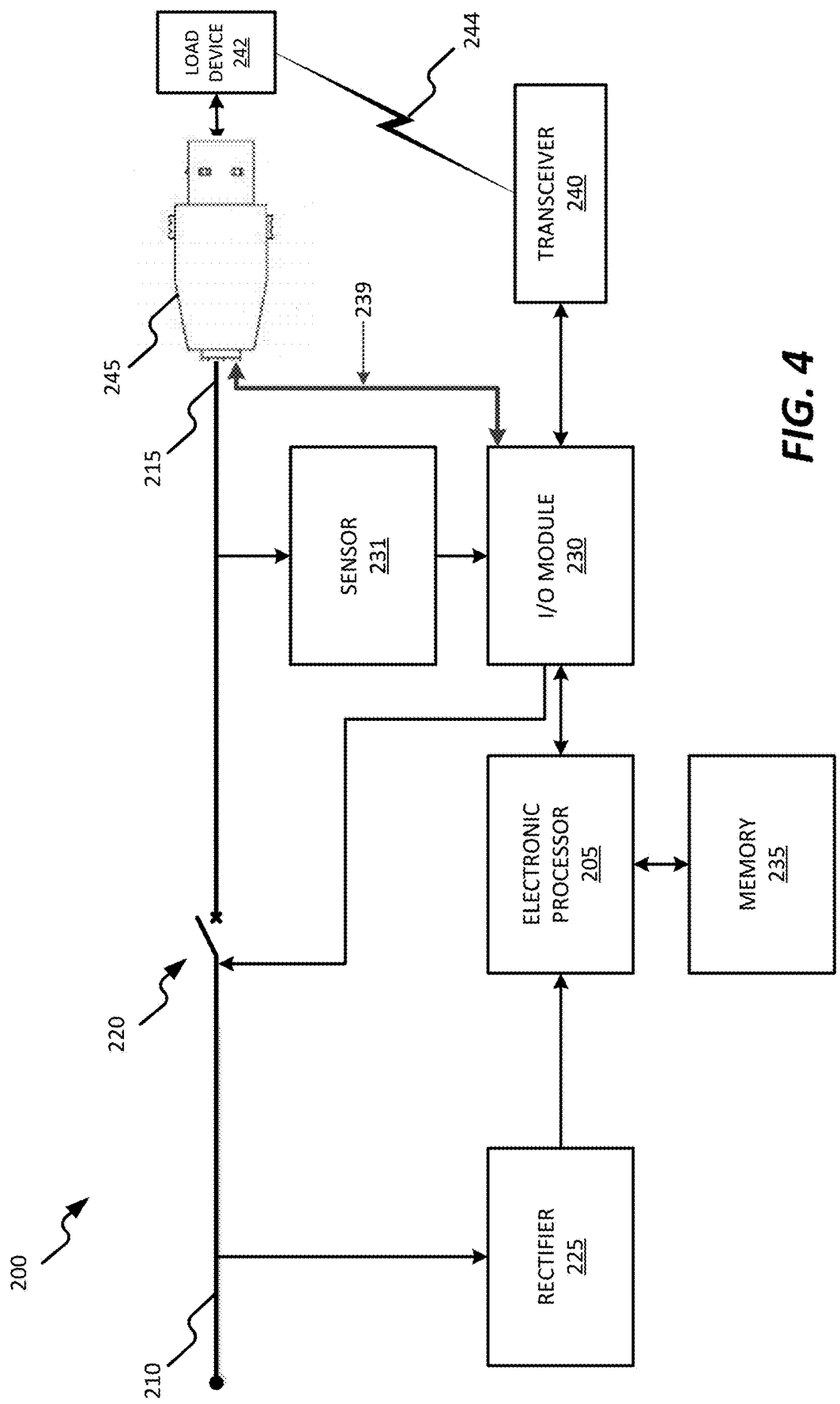
FIG. 4 is a block diagram of a testing circuit of the electrical receptacle of FIG. 1 according to some embodiments.

FIG. 4 is a block diagram illustrating a control system, or circuit, 200 within the receptacle 10. The control system 200 includes an electronic processor 205 (for example, a microprocessor or another suitable programmable device). The electronic processor 205 is electrically and/or communicatively connected to a variety of modules or components of the receptacle 10. For example, the electronic processor 205 is connected to a line terminal 210, a load terminal 215, an interrupting device 220, a rectifier 225, an input/output (I/O) module 230, a sensor 231, and a memory 235. In some embodiments the control system 200 also includes a communication link 239. In further embodiments, the control system 200 also includes a transceiver 240.

The memory 235 includes, for example, a program storage area and a data storage area. The program storage area and the data storage area can include combinations of different types of memory, such as read-only memory (ROM), random access memory (RAM), Various non-transitory computer readable media, for example, magnetic, optical, physical, or electronic memory may be used. The electronic processor 205 is communicatively coupled to the memory 235 and executes software instructions that are stored in the memory 235, or stored on another non-transitory computer readable medium such as another memory or a disc. The software may include one or more applications, program data, filters, rules, one or more program modules, and other executable instructions.

The line terminal 210 is configured to receive power (for example, line power). The line terminal 210 is selectively electrically connected, via the interrupting device 220, to the load terminal 215. The load terminal 215 is configured to output the power to a load device 242 (or external load) outside the system 200 electrically connected to an outlet 245. The outlet 245 is one or more of the electrical power/communication connectors of the receptacle, for example one of the outlets of the duplex outlet face 14, outlet 24, and outlet 28. In embodiments with more than one outlet 245, the system 200 may include duplicate and/or additional components such as those described below.

The load device 242 may be any kind of electrical device (for example, a home or commercial appliance, a computer, a portable communication device, a portable battery, and the like) configured to receive electrical power from the system 200. In some embodiments, the load device 242 includes a battery (not shown) that is charged when the load device 242 is connected to the system 200. In some embodiments, the load device 242 may be or include an adaptor configured to convert and/or rectify power received from the system 200. It should be understood that while the system and method are described below in terms of a single load device 242, in some embodiments more than one load device 242 may be connected to the system 200 through each of the outlet 245 and interact with the system 200 similarly as described below.

The interrupting device 220 is configured to interrupt the flow of power from the line terminal 210 to the load terminal 215. In some embodiments, the interrupting device 220 may include components of the core assembly 80, for example line contact arms 94, 96, contacts 102, 104, load contact arms 98, 100, and contacts 101, 103.

Although illustrated as a single line terminal 210, a single load terminal 215, and a single interrupting device 220, in other embodiments, the receptacle 10 may include two or more individually functioning line terminals 210, load terminals 215, and interrupting devices 220. For example, a first line terminal, a first load terminal, and a first interrupting device may correspond to a first outlet of the receptacle 10, while a second line terminal, a second load terminal, and a second interrupting device may correspond to a second outlet of the receptacle 10. For example, in some embodiments, line terminal 210, load terminal 215, and interrupting device 220 may correspond to outlet 24, while the second line terminal, the second load terminal, and the second interrupting device may correspond to outlet 28.

In some embodiments, the communication link 239 between the outlet 245 and the I/O module 230 is provided such that the electronic processor 205 can communicate with the load device 242. The communication link 239 may be a physical (wired) connection or an inductive short range communication system. In some embodiments, the communication link 239 is a near field communication link and is integrated with the outlet 245.

The rectifier 225 is configured to rectify the line power to a nominal power for use by the control system 200. In some embodiments, the rectifier 225 rectifies alternating current (AC) power to a nominal direct current (DC) power. In further embodiments, the rectifier 225 is positioned in series with the interrupting device 220 to additionally rectify the line power supplied to the load device 242 through the load terminal 215.

The I/O module 230 is configured to receive input and to provide output to peripherals. The I/O module 230 obtains information and signals from, and provides information and signals to, (for example, over one or more wired and/or wireless connections) devices both internal and external to the receptacle 10. For example, the I/O module 230 is configured to receive data from the sensor 231. In some embodiments, the I/O module 230 is configured to provide communication between the receptacle 10 and outside devices (for example, other receptacles, electrical devices, external computers, smart phones, tablets, etc.). In such an embodiment, the receptacle 10 may communicate with the one or more outside devices through a network using, for example, the transceiver 240. The network is, for example, a wide area network (WAN) (e.g., the Internet, a TCP/IP based network, a cellular network, such as, for example, a Global System for Mobile Communications [GSM] network, a General Packet Radio Service [GPRS] network, a Code Division Multiple Access [CDMA] network, an Evolution-Data Optimized [EV-DO] network, an Enhanced Data Rates for GSM Evolution [EDGE] network, a 3GSM network, a 4GSM network, a Digital Enhanced Cordless Telecommunications [DECT] network, a Digital AMPS [IS-136/TDMA] network, or an Integrated Digital Enhanced Network [iDEN] network, etc.). In other embodiments, the network is, for example, a local area network (LAN), a neighborhood area network (NAN), a home area network (HAN), or personal area network (PAN) employing any of a variety of communications protocols, such as Wi-Fi, Bluetooth, ZigBee, etc. In yet another embodiment, the network includes one or more of a wide area network (WAN), a local area network (LAN), a neighborhood area network (NAN), a home area network (HAN), or personal area network (PAN).

The sensor 231 is configured to sense/measure at least one electrical characteristic related to the load device 242 electrically connected to the outlet 245. The electrical characteristic is, for example, a voltage, a current, and/or a resistance. In some embodiments, the sensor 231 is a current sensor configured to measure the current sourced to the load device 242 through the load terminal 215.

The transceiver 240 is configured to enable wireless communication between the receptacle 10 and the load device 242, via, for example, wireless communication link 244. In other embodiments, rather than a transceiver 240, the receptacle 10 may include separate transmitting and receiving components, for example, a transmitter and a receiver. In operation, the electronic processor 205 is configured to control the transceiver 240 to transmit and receive data to and from the receptacle 10. The electronic processor 205 encodes and decodes digital data sent and received by the transceiver 240. The transceiver 240 transmits and receives radio signals to and from various wireless communication networks. For example, in some embodiments, the transceiver 240 is configured to communicate with a home automation (smart home) hub. A home automation or smart home hub is a hardware device that connects devices on a home automation network and controls communications among them. The home automation hub may further be communicatively coupled to one or more remote servers that the transceiver 240 may be configured to access directly or indirectly through the home automation hub. The electronic processor 205 and the transceiver 240 may include various digital and analog components, which for brevity are not described herein and which may be implemented in hardware, software, or a combination of both. Some embodiments include separate transmitting and receiving components, for example, a transmitter and a receiver, instead of a combined transceiver 240.

Figure 5:
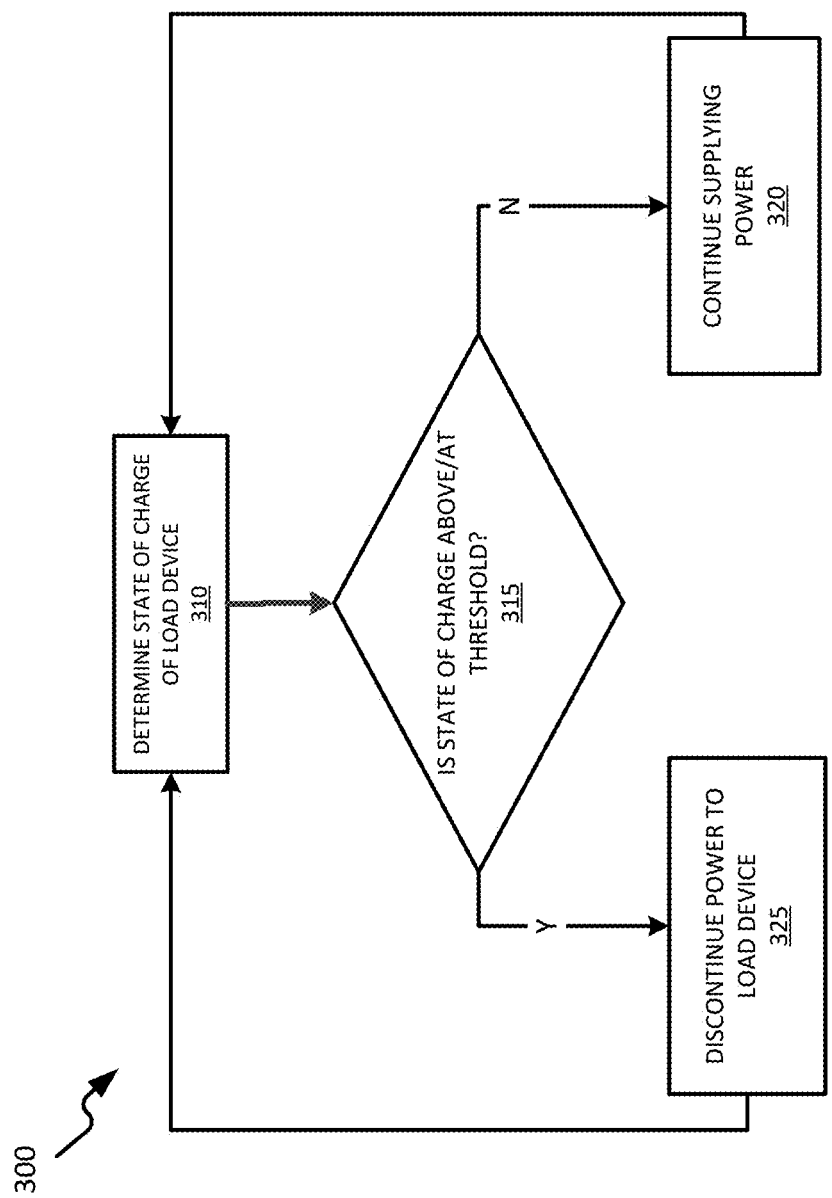
FIG. 5 is a flowchart illustrating an operation of the electrical receptacle of FIG. 1 according to some embodiments.

FIG. 5 illustrates a process, or operation, 300 of the receptacle 10 according to some embodiments. As an example, the method 300 is described as being performed by the electronic processor 205 of the system 200 within the receptacle 10 illustrated in FIGS. 4 and 1, respectively, described above. It should be understood that the order of the steps disclosed in operation 300 could vary. Although illustrated as occurring in parallel order, in other embodiments, the steps disclosed may be performed in serial order. Furthermore, additional steps may be added to the process and not all of the steps may be required.

At block 310, the electronic processor 205 determines a state of charge (in other words, current charge capacity) of a battery of the load device 242 based on an electrical characteristic. In some embodiments, the electronic processor 205 communicates, via the transceiver 240, with the load device 242 to determine the state of charge of the battery.

In some embodiments, the electronic processor 205 receives, from the sensor 231, an electrical characteristic. The electrical characteristic may be a single value or a time series of data points. The electrical characteristic may be used to determine the state of charge of the load device 242.

In some embodiments, additional information is provided to the electronic processor 205, for example, through the transceiver 240 or the communication link 239. The information may be used to identify the particular load device 242. For example, the information could include the type of load or device, the manufacturer of the load, and/or the make/model of the load. In some embodiments, the information includes a unique identifier to discern the particular load device 242 from other load devices of the same type, manufacturer, and/or make/model (for example, a serial number). In further embodiments, the additional information may be used to determine a state of charge of a battery of the load device 242.

At block 315, the electronic processor 205 determines if the state of charge is at or above a predetermined threshold. In some embodiments, the threshold corresponds to a full charge capacity of the battery of the load device 242. In further embodiments, the electronic processor 205 determines the threshold depending on the identity of the load device 242. In such embodiments, the threshold is calculated based on a charging history of the load device 242, for example, usage since last charge. The charging history of the load device 242 may be stored within the memory 235 or a remote server or database. In such embodiments, the charging history may be stored on a remote server through a home automation (smart home) hub. The threshold may also be calculated based on one or more charging characteristics of the load device 242, for example a maximum charge time or a measure of usage since last charge. Such charging characteristics may be stored within the memory 235 or a remote server or database (for example, a server in communication with a smart home hub). In such embodiments, the electronic processor 205 provides information about the load device 242, for example the physical location of the load device 242 or the charging history of the load device 242.

When the state of charge of the battery is below the threshold, the electronic processor 205 proceeds supplying power to the load device 242 (block 320). In some embodiments, the electronic processor 205 is further configured to communicate, via the transceiver 240, with a home automation hub and receive, from the home automation hub, charging commands regarding the charging the load device 242. The charging commands are, for example, how much power to supply the load device 242 and when to start or stop charging the load device 242.

When the state of charge of the battery is at or above the threshold, the electronic processor 205 discontinues the supply of power to the load device 242 (block 325). In some embodiments, the electronic processor 205 activates the interrupting device 220 to discontinue the supply of power to the load device 242. In some embodiments, after discontinuing the supply of power to the load device 242, the control system 200 enters a standby (or sleep) mode reducing its power consumption. In the standby mode, the control system 200 may check at a predetermined time interval to verify if the load device 242 with a state of charge below the threshold is electrically connected to the outlet 245. The verification may be performed based on data from the sensor 231 or a signal received by the transceiver 240 from the load device 242.

In the foregoing specification, specific embodiments have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized electronic processors (or "processing devices") such as microprocessors, digital signal processors, customized processors and field programmable gate arrays (FPGAs) and unique stored program instructions (including both software and firmware) that control the one or more electronic processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment may be implemented as a computer-readable storage medium having computer readable code stored thereon for programming a computer (for example, comprising an electronic processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A power receptacle comprising:
    an outlet configured to electrically connect to a load device;
    a sensor configured to sense an electrical characteristic of the load device; and
    an electronic processor configured to
        determine a state of charge of a battery of the load device based on the electrical characteristic,
        determine a predetermined charge threshold of the battery based on an identity of the load device,
        supply power to the load device when the state of charge of the battery is below the predetermined charge threshold,
        discontinue supply of power to the load device when the state of charge of the battery is at or above the predetermined charge threshold, and
        enter a standby mode upon discontinuing supply of power to the load device, wherein when in standby mode the electronic processor, at predetermined time intervals, verifies that the state of charge of the battery is at or above the predetermined charge threshold.

2. The power receptacle of claim 1, wherein the identity of the load device is based on at least one selected from a group consisting of a manufacturer of the load device, a made of the load device, a model of the load device, and a unique identifier of the load device.

3. The power receptacle of claim 1 wherein the electronic processor is further configured to communicate, via a transceiver or a communication link, with the load device to determine the state of charge of the battery.

4. The power receptacle of claim 1 further comprising a transceiver.

5. The power receptacle of claim 4 wherein the electronic processor is further configured to communicate, via the transceiver, with a home automation hub and receive, from the home automation hub, a charging command.

6. The power receptacle of claim 1, wherein the electronic processor is further configured to reference a charging characteristic of the load device to determine when to stop supplying power to the battery.

7. The power receptacle of claim 6, wherein the charging characteristic is one selected from the group consisting of a maximum charge time, usage since last charge, and charging history.

8. The power receptacle of claim 1, wherein the electronic processor further determines the state of charge of the battery of the load device based on a communication with the load device.

9. A method of operating a power receptacle electrically connected to a load device, the method comprising:
   sensing, via a sensor, an electrical characteristic of the load device;
   determining a state of charge of a battery of the load device based on the electrical characteristic;
   determining a predetermined charge threshold of the battery based on an identity of the load device;
   supplying power to the load device when the state of charge of the battery is below the predetermined charge threshold;
   discontinuing supply of power to the load device when the state of charge of the battery is at or above the predetermined charge threshold; and
   entering a standby mode upon discontinuing supply of power to the load device, wherein when in standby mode the electronic processor, at predetermined time intervals, verifies that the state of charge of the battery is at or above the predetermined charge threshold.

10. The method of claim 9, wherein the identity of the load device is based on at least one selected from a group consisting of a manufacturer of the load device, a made of the load device, a model of the load device, and a unique identifier of the load device.

11. The method of claim 9, further comprising communicating, via a transceiver or a communication link, with the load device to determine the state of charge of the battery.

12. The method of claim 9, further comprising communicating, via a transceiver, with a home automation hub and receiving, from the home automation hub, charging commands.

13. The method of claim 9, further comprising referencing a charging characteristic of the load device to determine when to stop supplying power to the battery.

14. The method of claim 9, further comprising determining the state of charge of the battery of the load device is based on a communication with the load device.

15. The power receptacle of claim 1, further comprising:
   a front cover having the outlet;
   a rear cover secured to the front cover, the rear cover including one or more mounts to mount the power receptacle; and
   an interrupting device positioned within the front cover and the rear cover, the interrupting device configured to interrupt power to the load device when activated;
   wherein, when the electronic processor discontinues supply of power to the load device when the state of charge of the battery is at or above the predetermined charge threshold, the electronic processor activates the interrupting device.

* * * * *